(12) United States Patent
Ho et al.

(10) Patent No.: US 10,510,758 B2
(45) Date of Patent: Dec. 17, 2019

(54) SEMICONDUCTOR MEMORY DEVICE AND MANUFACTURING METHOD THEREOF

(71) Applicant: UNITED MICROELECTRONICS CORP., Hsin-Chu (TW)

(72) Inventors: Yen-Ting Ho, Taipei (TW); Sung-Bin Lin, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 83 days.

(21) Appl. No.: 15/725,275

(22) Filed: Oct. 4, 2017

(65) Prior Publication Data
US 2019/0103405 A1  Apr. 4, 2019

(51) Int. Cl.
| | |
|---|---|
| *H01L 21/30* | (2006.01) |
| *H01L 27/105* | (2006.01) |
| *H01L 21/28* | (2006.01) |
| *H01L 29/66* | (2006.01) |
| *H01L 27/11517* | (2017.01) |
| *H01L 29/51* | (2006.01) |

(Continued)

(52) U.S. Cl.
CPC .... *H01L 27/1052* (2013.01); *H01L 21/28247* (2013.01); *H01L 27/11517* (2013.01); *H01L 29/40114* (2019.08); *H01L 29/42324* (2013.01); *H01L 29/518* (2013.01); *H01L 29/6656* (2013.01); *H01L 29/66477* (2013.01); *H01L 29/66825* (2013.01); *H01L 29/788* (2013.01)

(58) Field of Classification Search
CPC ........ H01L 21/28247; H01L 21/28273; H01L 27/1052; H01L 27/115; H01L 27/11517; H01L 29/42324; H01L 29/518; H01L 29/66477; H01L 29/6656; H01L 29/66825; H01L 29/788
USPC .......................... 438/257–267; 257/314–322
See application file for complete search history.

(56) References Cited

U.S. PATENT DOCUMENTS

| | | |
|---|---|---|
| 5,298,446 A | 3/1994 | Onishi |
| 5,460,992 A | 10/1995 | Hasegawa |

(Continued)

OTHER PUBLICATIONS

Song, "Highly manufacturable 90nm NOR flash technology with 0.081 um2 cell size", 2003 symposium on VLSI Technology Digest of Technical Papers, Jun. 11, 2003.

(Continued)

*Primary Examiner* — Brook Kebede
(74) *Attorney, Agent, or Firm* — Winston Hsu (57) ABSTRACT

A manufacturing method of a semiconductor memory device includes the following steps. A gate structure is formed on a semiconductor substrate. The gate structure includes a floating gate electrode, a control gate electrode, a first oxide layer, and a second oxide layer. The control gate electrode is disposed on the floating gate electrode. The first oxide layer is disposed between the floating gate electrode and the semiconductor substrate. The second oxide layer is disposed between the floating gate electrode and the control gate electrode. An oxide spacer layer is conformally on the gate structure and the semiconductor substrate. A nitride spacer is formed on the oxide spacer layer and on a sidewall of the gate structure. An oxidation process is performed after the step of forming the nitride spacer. A thickness of an edge portion of the first oxide layer is increased by the oxidation process.

21 Claims, 4 Drawing Sheets

(51) Int. Cl.
*H01L 29/423* (2006.01)
*H01L 29/788* (2006.01)

(56) References Cited

U.S. PATENT DOCUMENTS

| | | | |
|---|---|---|---|
| 6,429,108 B1* | 8/2002 | Chang | H01L 21/28273 |
| | | | 257/E21.209 |
| 2004/0046206 A1* | 3/2004 | Yun | H01L 21/28273 |
| | | | 257/315 |
| 2008/0067579 A1* | 3/2008 | Lee | H01L 29/42324 |
| | | | 257/321 |

OTHER PUBLICATIONS

Lin, Sung-Bin, "New ETOX composite offset Spacer", Invention Disclosure, Nov. 25, 2014, p. 1-17.

* cited by examiner

SEMICONDUCTOR MEMORY DEVICE AND MANUFACTURING METHOD THEREOF

BACKGROUND OF THE INVENTION

1. Field of the Invention

The present invention relates to a semiconductor memory device and a manufacturing method thereof, and more particularly, to a semiconductor memory device including a gate structure and a manufacturing method thereof.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. Non-volatile memory devices have been commercially used nowadays. The non-volatile memory devices include mask read-only memory (Mask ROM), programmable read-only memory (PROM), erasable programmable read-only memory (EPROM), electrically erasable programmable read-only memory (EEPROM), and flash memory. As the physical size of the flash memory device becomes smaller, some operation performance of the flash memory device may be influenced more obviously by small variations of some parts in the flash memory device, and the related manufacturing processes and/or the structural design have to be further modified for better performance and higher integrity requirements.

SUMMARY OF THE INVENTION

A semiconductor memory device and a manufacturing method thereof are provided by the present invention. A nitride spacer is used to prevent an oxide layer disposed between a control gate electrode and a floating gate electrode from being encroached by an oxidation process configured to increase a thickness of an oxide layer disposed between the floating gate and a semiconductor substrate. Electrical properties such as gate coupling ratio (GCR) and threshold voltage ($V_t$) window of the semiconductor memory device may be increased, and the reliability of the semiconductor memory device may be improved accordingly.

According to one embodiment of the present invention, a manufacturing method of a semiconductor memory device is provided. The manufacturing method includes the following steps. A gate structure is formed on a semiconductor substrate. The gate structure includes a floating gate electrode, a control gate electrode, a first oxide layer, and a second oxide layer. The control gate electrode is disposed on the floating gate electrode. The first oxide layer is disposed between the floating gate electrode and the semiconductor substrate. The second oxide layer is disposed between the floating gate electrode and the control gate electrode. An oxide spacer layer is conformally on the gate structure and the semiconductor substrate. A nitride spacer is formed on the oxide spacer layer and on a sidewall of the gate structure. An oxidation process is performed after the step of forming the nitride spacer. A thickness of an edge portion of the first oxide layer is increased by the oxidation process.

According to one embodiment of the present invention, a semiconductor memory device is provided. The semiconductor memory device includes a semiconductor substrate and a gate structure. The gate structure is disposed on the semiconductor substrate. The gate structure includes a floating gate electrode, a control gate electrode, a first oxide layer, and a second oxide layer. The control gate electrode is disposed on the floating gate electrode. The first oxide layer is disposed between the floating gate electrode and the semiconductor substrate. The second oxide layer is disposed between the floating gate electrode and the control gate electrode. A thickness of an edge portion of the first oxide layer is larger than a thickness of a center portion of the first oxide layer. A thickness of an edge portion of the second oxide layer is substantially equal to a thickness of a center portion of the second oxide layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-5 are schematic drawings illustrating a manufacturing method of a semiconductor memory device according to a first embodiment of the present invention, wherein

FIG. 6 and FIG. 7 are schematic drawings illustrating a manufacturing method of a semiconductor memory device according to a second embodiment of the present invention, wherein

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Figure 1:
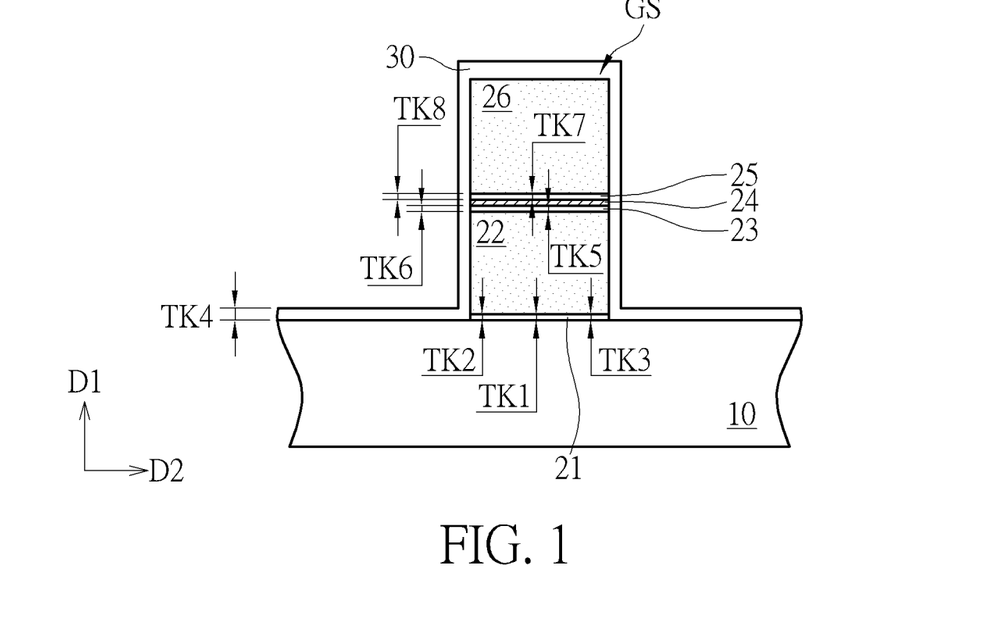

Please refer to FIGS. 1-5. FIGS. 1-5 are schematic drawings illustrating a manufacturing method of a semiconductor memory device according to a first embodiment of the present invention. The manufacturing method of the semiconductor memory device in this embodiment includes the following steps. As shown in FIG. 1, a gate structure GS is formed on a semiconductor substrate 10. In some embodiments, the semiconductor substrate 10 may include a silicon substrate, an epitaxial substrate, a silicon carbide substrate, or a silicon-on-insulator (SOI) substrate, but not limited thereto. The gate structure GS may include a first oxide layer 21, a floating gate electrode 22, a second oxide layer 23, and a control gate electrode 26. The control gate electrode 26 is disposed on the floating gate electrode 22 in a thickness direction D1 of the semiconductor substrate. The first oxide layer 21 is disposed between the floating gate electrode 22 and the semiconductor substrate 10 in the thickness direction D1 and the second oxide layer 23 is disposed between the floating gate electrode 22 and the control gate electrode 26 in the thickness direction. In other words, the first oxide layer 21, the floating gate electrode 22, the second oxide layer 23, and the control gate electrode 26 may be sequentially stacked on the semiconductor substrate 10. In some embodiments, the floating gate electrode 22 and the control gate electrode 26 may include polycrystalline silicon respectively, but not limited thereto. In some embodiments, the floating gate electrode 22 and the control gate electrode 26 may be made of other suitable non-metal conductive materials or metal conductive materials, and/or the material of the floating gate electrode 22 may be different from the material of the control gate electrode 26. The first oxide layer 21 and the second oxide layer 23 may include silicon oxide or other suitable oxide materials. The first oxide layer 21 may be regarded as a tunnel oxide layer of a semiconductor memory device, and the second oxide layer 23 may be regarded as at least a part of an inter-poly dielectric (IPD), but not limited thereto. In some embodiments, the gate structure GS may further include a nitride layer 24 and a third oxide layer 25. The nitride layer 24 may be disposed between the control gate electrode 26 and the second oxide layer 23 in the thickness direction D1 of the semiconductor substrate 10, and the third oxide layer 25 may be disposed between the nitride layer 24 and the control gate electrode 26 in the thickness direction D1. The third oxide layer 25 may include silicon oxide or other suitable oxide materials, and the nitride layer 24 may include silicon nitride or other suitable nitride materials. The second oxide layer 23, the nitride layer 24 and the third oxide layer 25 may constitute an oxide-nitride-oxide (ONO) IPD structure disposed between the control gate electrode 26 and the floating gate electrode 22. In some embodiments, there may be only the second oxide layer 23 sandwiched in between the control gate electrode 26 and the floating gate electrode 22. After the step of forming the gate structure GS, an oxide spacer layer 30 is conformally formed on the gate structure GS and the semiconductor substrate 10. In some embodiments, the oxide spacer layer 30 may include silicon oxide or other suitable oxide materials, and the oxide spacer layer 30 may be formed by a chemical vapor deposition (CVD) process, such as a high temperature oxide (HTO) CVD process, but not limited thereto.

In some embodiments, a thickness of the oxide spacer layer 30 (such as a fourth thickness TK4 shown in FIG. 1) may be larger than a thickness of the first oxide layer 21 (such as a first thickness TK1, a second thickness TK2, and a third thickness TK3 shown in FIG. 1). For example, the thickness of the oxide spacer layer 30 formed on the sidewall of the gate structure GS may range from 100 angstroms to 200 angstroms, the fourth thickness TK4 of the oxide spacer layer 30 may range from 150 angstroms to 250 angstroms, and the thickness of the first oxide layer 21 may range from 95 angstroms to 125 angstroms, but not limited thereto. The thickness distribution of the first oxide layer 21 may be relatively uniform before the step of forming the oxide spacer layer 30 and other subsequent processes. Specifically, in some embodiments, before the step of forming the oxide spacer layer 30 and other subsequent processes, a thickness of an edge portion of the first oxide layer 21 (such as the second thickness TK2 and/or the third thickness TK3) may be substantially equal to a thickness of a center portion of the first oxide layer 21 (such as the first thickness TK1) with a tolerance of ±5% because of the manufacturing variation. For example, the maximum thickness of the first oxide layer 21 may be smaller than or equal to 1.05 times the average thickness of the first oxide layer 21, and the minimum thickness of the first oxide layer 21 may be larger than or equal to 0.95 times the average thickness of the first oxide layer 21 before the step of forming the oxide spacer layer 30 and other subsequent processes, but not limited thereto. Similarly, before the step of forming the oxide spacer layer 30 and other subsequent processes, a thickness of an edge portion of the second oxide layer 23 (such as a sixth thickness TK6 shown in FIG. 1) may be substantially equal to a thickness of a center portion of the second oxide layer 23 (such as a fifth thickness TK5 shown in FIG. 1) with a tolerance of ±5%, and a thickness of an edge portion of the third oxide layer 25 (such as an eighth thickness TK8 shown in FIG. 1) may be substantially equal to a thickness of a center portion of the third oxide layer 25 (such as a seventh thickness TK7 shown in FIG. 1) with a tolerance of ±5%, but not limited thereto.

Figure 2:
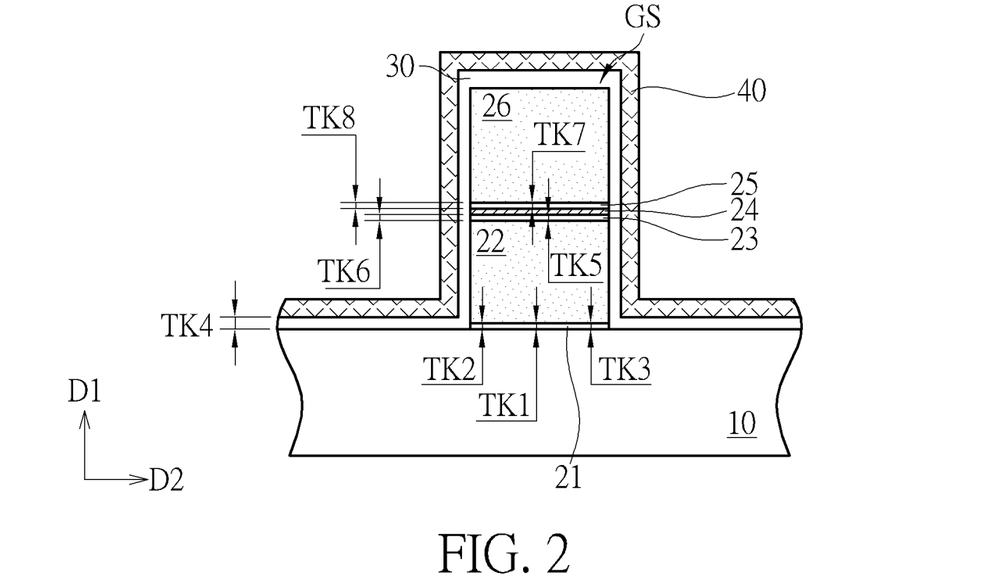
FIG. 2 is a schematic drawing in a step subsequent to FIG. 1.
Figure 3:
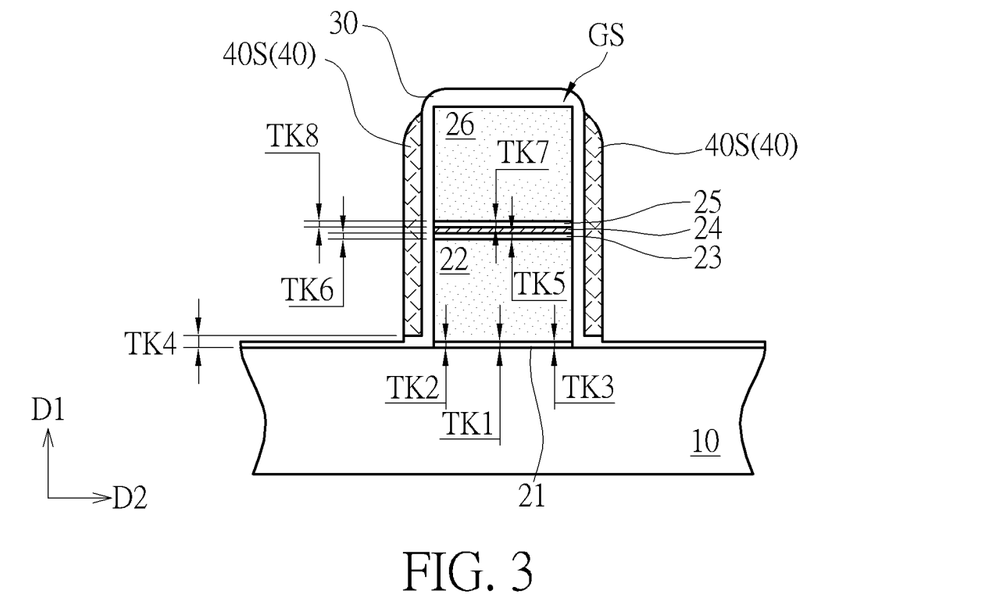
FIG. 3 is a schematic drawing in a step subsequent to FIG. 2.

As shown in FIG. 2 and FIG. 3, a nitride spacer layer 40 may be conformally formed on the oxide spacer layer 30, and an anisotropic etching process may be performed to the nitride spacer layer 40 for forming a nitride spacer 40S on the oxide spacer layer 30 and on a sidewall of the gate structure GS. In some embodiments, the nitride spacer layer 40 may include silicon nitride or other suitable nitride insulation materials. The nitride spacer 40S may cover the second oxide layer 23, the nitride layer 24, and the third oxide layer 25 in a horizontal direction D2, and the horizontal direction D2 may be orthogonal to the thickness direction D1 of the semiconductor substrate 10, but not limited thereto. Because the fourth thickness TK4 of the oxide spacer layer 30 may be larger than the thickness of the first oxide layer 21, the first oxide layer 21 may not be covered by the nitride spacer 40S in the horizontal direction D2. In some embodiments, the thickness of the nitride spacer 40S in the horizontal direction D2 may range from 70 angstroms to 200 angstroms, but not limited thereto.

Figure 4:
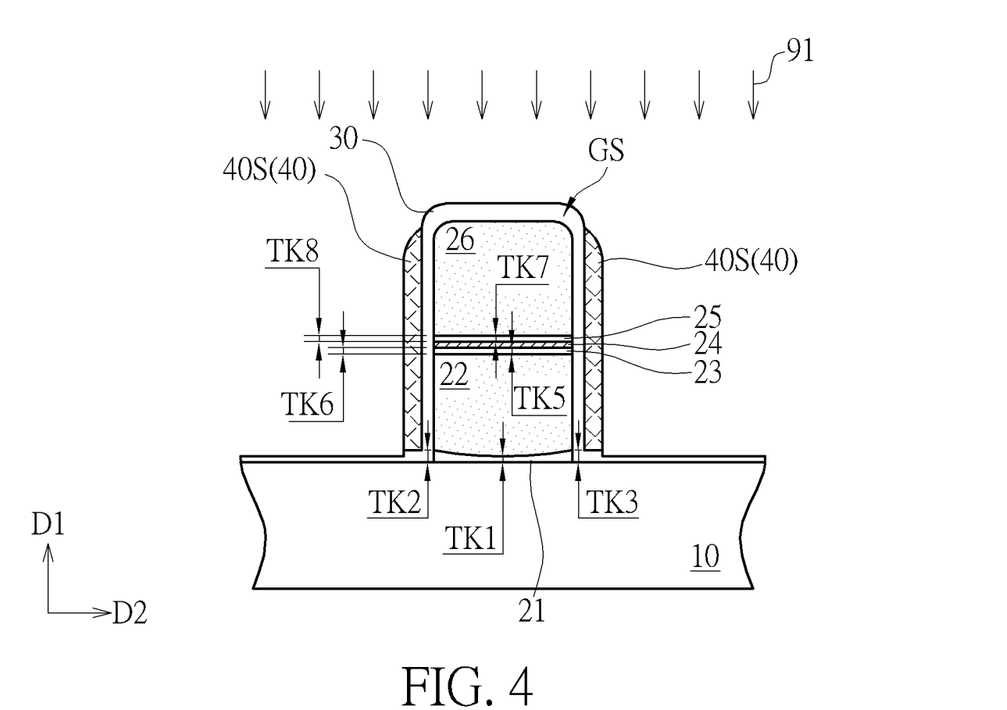
FIG. 4 is a schematic drawing in a step subsequent to FIG. 3.

As shown in FIG. 4, an oxidation process 91 may be performed after the step of forming the nitride spacer 40S, and the thickness of the first oxide layer 21 may be increased by the oxidation process 91. In some embodiments, the oxidation process 91 may include a thermal treatment in an oxygen-rich process environment or other suitable oxidation approaches. The second oxide layer 23, the nitride layer 24, and the third oxide layer 25 may be covered by the nitride spacer 40S in the horizontal direction D2 during the oxidation process 91 while the first oxide layer 21 is not covered by the nitride spacer 40S in the horizontal direction D2 during the oxidation process 91, and the oxide spacer layer 30 directly contacts a topmost surface of the control gate electrode 26 during the oxidation process 91. The first oxide layer 21 may be encroached by the oxidation process 91 especially at an edge portion of the first oxide layer 21, and the thickness of an edge portion of the first oxide layer 21 may be increased accordingly. Therefore, a thickness of an edge portion of the first oxide layer 21 (such as the second thickness TK2 and/or the third thickness TK3 shown in FIG. 4) may become larger than a thickness of a center portion of the first oxide layer 21 (such as the first thickness TK1 shown in FIG. 4) after the oxidation process 91. For example, in some embodiments, the thickness of the edge portion of the first oxide layer 21 (such as the second thickness TK2 and/or the third thickness TK3) may range from 1.3 times the first thickness TK1 of the center portion of the first oxide layer 21 to 1.5 times the first thickness TK1 of the center portion of the first oxide layer 21 after the oxidation process 91, but not limited thereto. However, a thickness of an edge portion of the second oxide layer 23 (such as the sixth thickness TK6 shown in FIG. 4) may be substantially equal to a thickness of a center portion of the second oxide layer 23 (such as the fifth thickness TK5 shown in FIG. 4) with a tolerance of ±5% after the oxidation process 91, and a thickness of an edge portion of the third oxide layer 25 (such as the eighth thickness TK8 shown in FIG. 4) may be substantially equal to a thickness of a center portion of the third oxide layer 25 (such as the seventh thickness TK7 shown in FIG. 4) with a tolerance of ±5% after the oxidation process 91 because the second oxide layer 23, the nitride layer 24, and the third oxide layer 25 may be covered by the nitride spacer 40S in the horizontal direction D2 during the oxidation process 91. In other words, the second oxide layer 23 and the third oxide layer 25 may not be encroached by the oxidation process 91 because of the protection formed by the nitride spacer 40S, and the thickness TK6 of the edge portion of the second oxide layer 23 before the oxidation process 91 is equal to the thickness TK6 of the edge portion of the second oxide layer 23 after the oxidation process 91.

Figure 5:
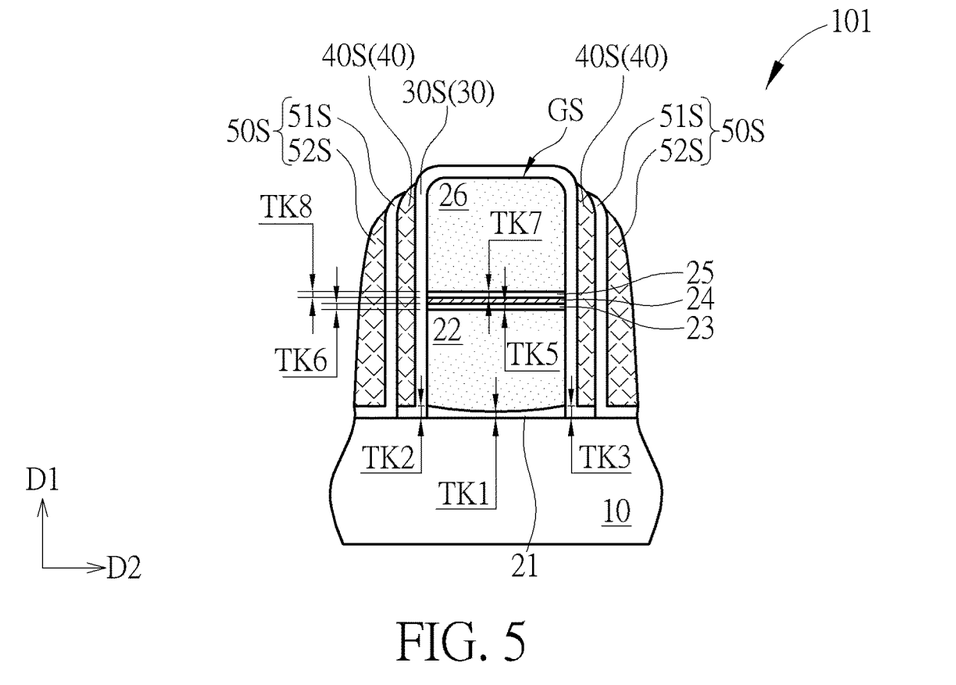
FIG. 5 is a schematic drawing in a step subsequent to FIG. 4.

As shown in FIG. 4 and FIG. 5, a spacer structure 50S may be formed on the nitride spacer 40S and the oxide spacer layer 30 and formed on the sidewall of the gate structure GS after the oxidation process 91. In some embodiments, another etching process may be performed to remove a part of the oxide spacer layer 30 uncovered by the nitride spacer 40S before the step of forming the spacer structure 50S, and a first oxide spacer 30S may be formed by the etching process, but not limited thereto. The spacer structure 50S may include a single layer or a multiple layer spacer structure. A semiconductor memory device 101 shown in FIG. 5 may be formed by the manufacturing method described above. The semiconductor memory device 101 may include the semiconductor substrate 10 and the gate structure GS. The gate structure GS is disposed on the semiconductor substrate 10. The gate structure GS includes the floating gate electrode 22, the control gate electrode 26, the first oxide layer 21, and the second oxide layer 23. The control gate electrode 26 is disposed on the floating gate electrode 22. The first oxide layer 21 is disposed between the floating gate electrode 22 and the semiconductor substrate 10. The second oxide layer 23 is disposed between the floating gate electrode 22 and the control gate electrode 26. The thickness of the edge portion of the first oxide layer 21 (such as the second thickness TK2 and/or the third thickness TK3) is larger than the thickness of the center portion of the first oxide layer 21 (such as the first thickness TK1), and the center portion of the first oxide layer 21 is curved. For example, in some embodiments, the thickness of the edge portion of the first oxide layer 21 (such as the second thickness TK2 and/or the third thickness TK3) may range from 1.3 times the first thickness TK1 of the center portion of the first oxide layer 21 to 1.5 times the first thickness TK1 of the center portion of the first oxide layer 21, but not limited thereto. The thickness of the edge portion of the second oxide layer 23 (such as the sixth thickness TK6) is substantially equal to the thickness of the center portion of the second oxide layer 23 (such as the fifth thickness TK5). In some embodiments, the sixth thickness TK6 of the edge portion of the second oxide layer 23 may be substantially equal to the fifth thickness TK5 of the center portion of the second oxide layer 23 with a tolerance of ±5%, but not limited thereto.

In some embodiments, the gate structure GS may further include the nitride layer 24 and the third oxide layer 25. The nitride layer 24 may be disposed between the control gate electrode 26 and the second oxide layer 23, and the third oxide layer 25 may be disposed between the nitride layer 24 and the control gate electrode 26. In some embodiments, the eighth thickness TK8 of the edge portion of the third oxide layer 25 may be substantially equal to the seventh thickness TK7 of the center portion of the third oxide layer 25 with a tolerance of ±5%, but not limited thereto. The first oxide layer 21 may be regarded as a tunnel oxide layer of the semiconductor memory device 101, and the second oxide layer 23, the nitride layer 24, and the third oxide layer 25 may be regarded as an inter-poly dielectric (IPD), but not limited thereto. Accordingly, the gate coupling ratio (CGR) of the semiconductor memory device 101 may be increased because the capacitance of the IPD is not decreased while the capacitance of the tunnel oxide is decreased by the increased thickness of the first oxide layer 21. The threshold voltage ($V_t$) variation between different memory units may be decreased because the encroachment of the IPD may be prevented by the nitride spacer 40S, and the threshold voltage window of the semiconductor memory device 101 may be improved. The encroachment of the first oxide layer 21 may be used to improve the endurance of the semiconductor memory device 101 and decrease the stress of the first oxide spacer 30S. The programming voltage and the erasing voltage of the semiconductor memory device 101 may be decreased because of the higher CGR, the junction leakage of the semiconductor memory device 101 may be decreased accordingly, and the reliability and endurance of the semiconductor memory device 101 may be enhanced.

As shown in FIG. 5, the semiconductor memory device 101 may further include the first oxide spacer 30S, a first nitride spacer (i.e. the nitride spacer 40S), a second oxide spacer 51S, and a second nitride spacer 52S. The second oxide spacer 51S may include silicon oxide or other suitable oxide insulation materials, and the second nitride spacer 52S may include silicon nitride or other suitable nitride insulation materials. The first oxide spacer 30S is disposed on the sidewall of the gate structure GS, the first oxide spacer 30S may include an L-shaped spacer in a cross-sectional view of the semiconductor memory device 101, and the second thickness TK2 of the edge portion of the first oxide layer 21 is substantially equal to the thickness of the first oxide spacer 30S (e.g. the fourth thickness TK4 of the oxide spacer layer 30 shown in FIG. 3). The nitride spacer 40S is disposed on the first oxide spacer 30S. The second oxide spacer 51S is disposed on the first nitride spacer (i.e. the nitride spacer 40S), and the second oxide spacer 51S may include an L-shaped spacer in the cross-sectional view of the semiconductor memory device 101. The second nitride spacer 52S may be disposed on the second oxide spacer 51S. In other words, the semiconductor memory device 101 may include an oxide-nitride-oxide-nitride spacer structure composed of the first oxide spacer 30S, the first nitride spacer (i.e. the nitride spacer 40S), the second oxide spacer 51S, and the second nitride spacer 52S. In some embodiments, the semiconductor memory device 101 may further include a selecting gate (not shown), an erase gate (not shown), a source region (not shown), and/or a drain region (not shown) according to other design consideration, but not limited thereto.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 6:
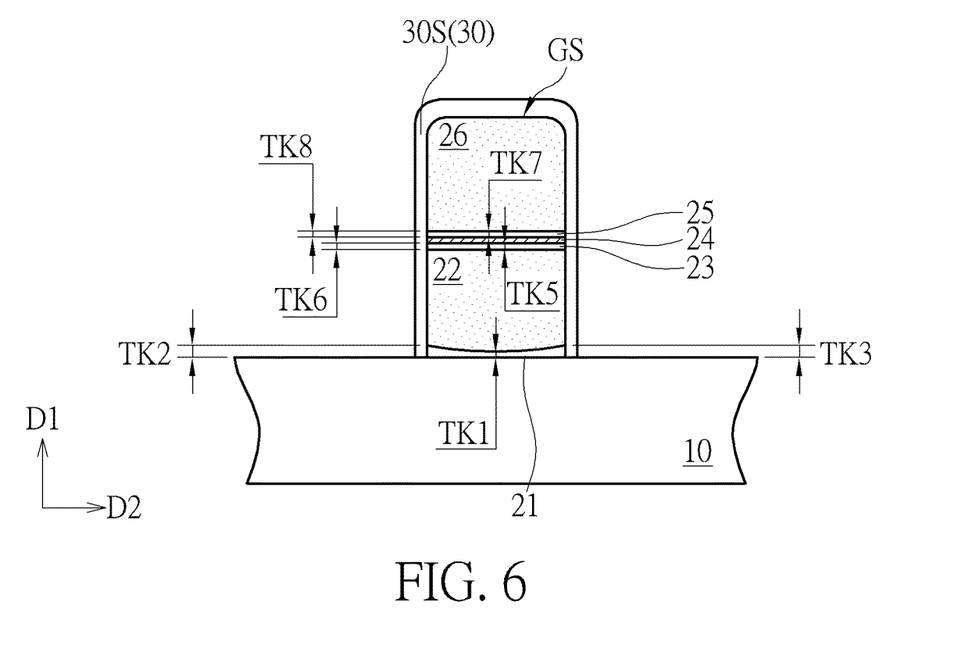
Figure 7:
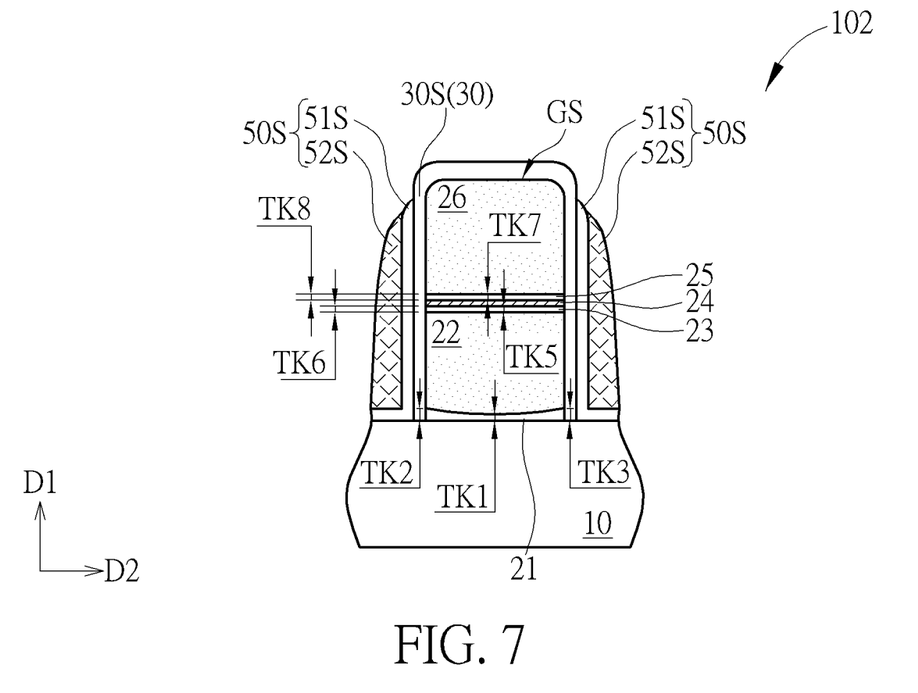
FIG. 7 is a schematic drawing in a step subsequent to FIG. 6.

Please refer to FIG. 6, FIG. 7, and FIG. 4. FIG. 6 and FIG. 7 are schematic drawings illustrating a manufacturing method of a semiconductor memory device 102 according to a second embodiment of the present invention. FIG. 6 may be regarded as a schematic drawing in a step subsequent to FIG. 4. As shown in FIG. 4, FIG. 6, and FIG. 7, the difference between the manufacturing method in this embodiment and the manufacturing method in the first embodiment mentioned above is that the nitride spacer 40S may be removed after the oxidation process 91 and before the step of forming the spacer structure 50S in this embodiment for reducing the area of the semiconductor memory device 102. In some embodiments, the nitride spacer 40S may be removed by an etching process, and another dry etching process may be performed to the oxide spacer layer 30 for forming the first oxide spacer 30S, but not limited thereto. Accordingly, as shown in FIG. 7, the semiconductor memory device 102 include an oxide-oxide-nitride spacer structure composed of the first oxide spacer 30S, the second oxide spacer 51S, and the second nitride spacer 52S.

To summarize the above descriptions, in the semiconductor memory device and the manufacturing method thereof according to the present invention, the second oxide layer disposed between the floating gate electrode and the control gate electrode is protected by the nitride spacer from being encroached during the oxidation process configured to increase the thickness of the first oxide layer disposed between the floating gate and a semiconductor substrate. The CGR of the semiconductor memory device may be increased because the capacitance of the second oxide layer is not decreased while the capacitance of the tunnel oxide is decreased by the increased thickness of the first oxide layer. The threshold voltage variation may be decreased because the encroachment of the second oxide layer may be prevented by the nitride spacer, and the threshold voltage window of the semiconductor memory device may be improved. The programming voltage and the erasing voltage of the semiconductor memory device may be decreased because of the higher CGR. The reliability and endurance of the semiconductor memory device may be enhanced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor memory device, comprising:
   forming a gate structure on a semiconductor substrate, wherein the gate structure comprises:
   a floating gate electrode;
   a control gate electrode disposed on the floating gate electrode;
   a first oxide layer disposed between the floating gate electrode and the semiconductor substrate; and
   a second oxide layer disposed between the floating gate electrode and the control gate electrode;
   forming an oxide spacer layer conformally on the gate structure and the semiconductor substrate;
   forming a nitride spacer on the oxide spacer layer and on a sidewall of the gate structure; and
   performing an oxidation process after the step of forming the nitride spacer, wherein a thickness of an edge portion of the first oxide layer is increased by the oxidation process, and a thickness of an edge portion of the second oxide layer before the oxidation process is equal to the thickness of the edge portion of the second oxide layer after the oxidation process, wherein the oxide spacer layer directly contacts a topmost surface of the control gate electrode during the oxidation process.

2. The manufacturing method of the semiconductor memory device according to claim 1, wherein the second oxide layer is covered by the nitride spacer in a horizontal direction during the oxidation process.

3. The manufacturing method of the semiconductor memory device according to claim 2, wherein the horizontal direction is orthogonal to a thickness direction of the semiconductor substrate.

4. The manufacturing method of the semiconductor memory device according to claim 1, wherein the thickness of the edge portion of the first oxide layer is larger than a thickness of a center portion of the first oxide layer after the oxidation process.

5. The manufacturing method of the semiconductor memory device according to claim 4, wherein the thickness of the edge portion of the first oxide layer ranges from 1.3 times the thickness of the center portion of the first oxide layer to 1.5 times the thickness of the center portion of the first oxide layer after the oxidation process.

6. The manufacturing method of the semiconductor memory device according to claim 1, wherein a thickness of the oxide spacer layer is larger than a thickness of the first oxide layer before the oxidation process.

7. The manufacturing method of the semiconductor memory device according to claim 1, wherein a thickness of an edge portion of the second oxide layer is substantially equal to a thickness of a center portion of the second oxide layer with a tolerance of ±5% after the oxidation process.

8. The manufacturing method of the semiconductor memory device according to claim 1, wherein the gate structure further comprises:
   a nitride layer disposed between the control gate electrode and the second oxide layer; and
   a third oxide layer disposed between the nitride layer and the control gate electrode.

9. The manufacturing method of the semiconductor memory device according to claim 8, wherein the second oxide layer, the nitride layer, and the third oxide layer are covered by the nitride spacer in a horizontal direction during the oxidation process.

10. The manufacturing method of the semiconductor memory device according to claim 8, wherein a thickness of an edge portion of the third oxide layer is substantially equal to a thickness of a center portion of the third oxide layer with a tolerance of ±5% after the oxidation process.

11. The manufacturing method of the semiconductor memory device according to claim 1, further comprising:
forming a spacer structure on the oxide spacer layer and on the sidewall of the gate structure after the oxidation process.

12. The manufacturing method of the semiconductor memory device according to claim 11, wherein the nitride spacer is removed after the oxidation process and before the step of forming the spacer structure.

13. The manufacturing method of the semiconductor memory device according to claim 1, wherein the floating gate electrode and the control gate electrode comprise polycrystalline silicon respectively.

14. A semiconductor memory device, comprising:
a semiconductor substrate; and
a gate structure disposed on the semiconductor substrate, wherein the gate structure comprises:
a floating gate electrode;
a control gate electrode disposed on the floating gate electrode;
a first oxide layer disposed between the floating gate electrode and the semiconductor substrate, wherein a thickness of an edge portion of the first oxide layer is larger than a thickness of a center portion of the first oxide layer;
a second oxide layer disposed between the floating gate electrode and the control gate electrode, wherein a thickness of an edge portion of the second oxide layer is substantially equal to a thickness of a center portion of the second oxide layer; and
a first oxide spacer disposed on a sidewall of the gate structure, wherein the center portion of the first oxide layer is curved and the thickness of the edge portion of the first oxide layer is substantially equal to a thickness of the first oxide spacer.

15. The semiconductor memory device according to claim 14, wherein the thickness of the edge portion of the second oxide layer is substantially equal to the thickness of the center portion of the second oxide layer with a tolerance of ±5%.

16. The semiconductor memory device according to claim 14, wherein the thickness of the edge portion of the first oxide layer ranges from 1.3 times the thickness of the center portion of the first oxide layer to 1.5 times the thickness of the center portion of the first oxide layer.

17. The semiconductor memory device according to claim 14, wherein the gate structure further comprises:
a nitride layer disposed between the control gate electrode and the second oxide layer; and
a third oxide layer disposed between the nitride layer and the control gate electrode.

18. The semiconductor memory device according to claim 17, wherein a thickness of an edge portion of the third oxide layer is substantially equal to a thickness of a center portion of the third oxide layer with a tolerance of ±5%.

19. The semiconductor memory device according to claim 14, further comprising:
a first nitride spacer disposed on the first oxide spacer;
a second oxide spacer disposed on the first nitride spacer, wherein the first oxide spacer comprises an L-shaped spacer in a cross-sectional view of the semiconductor memory device, and the second oxide spacer comprises an L-shaped spacer in the cross-sectional view of the semiconductor memory device; and
a second nitride spacer disposed on the second oxide spacer.

20. The semiconductor memory device according to claim 14, further comprising:
a second oxide spacer disposed on the first oxide spacer, wherein the second oxide spacer comprises an L-shaped spacer in a cross-sectional view of the semiconductor memory device; and
a second nitride spacer disposed on the second oxide spacer.

21. A semiconductor memory device, comprising:
a semiconductor substrate; and
a gate structure disposed on the semiconductor substrate, wherein the gate structure comprises:
a floating gate electrode;
a control gate electrode disposed on the floating gate electrode;
a first oxide layer disposed between the floating gate electrode and the semiconductor substrate, wherein a thickness of an edge portion of the first oxide layer is larger than a thickness of a center portion of the first oxide layer; and
a second oxide layer disposed between the floating gate electrode and the control gate electrode, wherein a thickness of an edge portion of the second oxide layer is substantially equal to a thickness of a center portion of the second oxide layer; and
an oxide spacer layer disposed on a sidewall of the gate structure, wherein a thickness of the oxide spacer layer is larger than the thickness of the center portion of the first oxide layer, wherein the center portion of the first oxide layer is curved and the thickness of the edge portion of the first oxide layer is substantially equal to the thickness of the oxide spacer layer.

* * * * *